(12) United States Patent
Kuijk et al.

(10) Patent No.: US 6,433,357 B1
(45) Date of Patent: Aug. 13, 2002

(54) DISPLAY DEVICE

(75) Inventors: Karel Elbert Kuijk; Marco Matters; Peter Tobias Herwig; Thomas Cleophas Theodorus Geuns, all of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/643,484

(22) Filed: Aug. 22, 2000

(51) Int. Cl.⁷ .......................... H01L 35/24; H01L 51/00
(52) U.S. Cl. ............................ 257/40; 257/72
(58) Field of Search ..................... 257/72, 40

(56) References Cited

U.S. PATENT DOCUMENTS 5,854,139 A * 12/1998 Aratani et al. .............. 438/780
5,994,717 A * 11/1999 Igarashi et al. ............... 257/59

OTHER PUBLICATIONS

Author; John G. Webster, Title; Encyclopedia of Electrical & Engineering, Publisher; John Wiley&Sons Inc., Publication Date: Mar. 19, 1999. vol. 11, pp. 441–459.*
Hirano Y et al: "Analysies of the Radiation Caused Characteristics Change in SOI Mosfets Using Field Shield Isolation" International Conference on Solid State Devices and Materials, JA, Japan Society of Applied Physics. Tokyo, Sep. 1998, pp. 314–315.

* cited by examiner

*Primary Examiner*—Olik Chaudhuri
*Assistant Examiner*—William C Vesperman
(74) *Attorney, Agent, or Firm*—Aaron Waxler

(57) ABSTRACT

Display device in which switching elements (5) are realized in an organic semiconductor layer. Mutual insulation of the elements and pixels is obtained either electrically by applying depletion via voltages to a guard line (4) or physically by making parts of the organic semiconductor layer insulating.

4 Claims, 5 Drawing Sheets

DISPLAY DEVICE

BACKGROUND OF THE INVENTION

The invention relates to a display device comprising a matrix of picture electrodes on a substrate, which picture electrodes are connected via switching elements to drive electrodes for presenting drive signals.

Such active matrix displays are used in laptop and desktop computers, but also in, for example, TV and video applications.

For use of these displays, research has been done for some time on possibilities of using organic material. For example, a display device of the type mentioned above is known from U.S. Pat. No. 5,854,139. In the display device described in this patent, a separate structured layer of organic material for the switching element is realized for each individual picture electrode. To this end, it is necessary to deposit either the organic material via a mask with apertures at the locations of the transistors to be realized, or to provide a uniform layer of organic material and subsequently etch it. In both cases, an extra masking step is necessary. Moreover, etching of the organic semiconductor materials usually proceeds so fast that etching is not very well possible in a reproducible manner.

SUMMARY OF THE INVENTION

It is, inter alia, an object of the present invention to obviate the above-mentioned drawbacks as much as possible. To this end, a display device according to the invention is characterized in that the display device comprises a layer of organic material accommodating a plurality of switching elements.

According to the invention, the switching elements can be realized in one and the same layer of organic materials, with the switching elements being mutually insulated in at least the operating state. Since this layer does not need to be structured separately, a simpler manufacture is possible. Moreover, such layers can be easily provided on synthetic material substrates (plastic) so that the much heavier glass substrates are not necessary. The use of plastic substrates is possible because all process steps take place at temperatures up to approximately 150° C. so that there are substantially no size changes.

A first embodiment of a display device according to the invention is characterized in that the substrate comprises a layer of organic semiconductor material at least at the area of the switching elements and the picture electrodes, and the display device comprises means for supplying at least one electrode, which, viewed perpendicularly to the substrate, substantially completely surrounds a picture electrode, with such a voltage that layers of organic semiconductor material at the area of switching elements and associated picture electrodes are substantially completely insulated from each other. The electrodes (guard lines) for a plurality of pixels are connected, for example, in an electrically conducting manner to an electrode which surrounds the complete picture surface and which is supplied with such a voltage during use that the semiconductor areas below (or above) the electrodes are insulating. The electrode may also be connected to a gate electrode of a TFT transistor in a matrix display. Since in a matrix of pixels only one row is selected at a time, the semiconductor areas below the gate electrodes are non-conducting during non-selection of the relevant row and constitute the desired insulator. By connecting the electrode to a gate electrode of a field effect transistor for a pixel in an adjacent row, a greater effective pixel surface is obtained.

If desired, said electrode may be provided as a pattern of guard lines underneath the semiconductor layer, with the pattern coinciding, for example, partly with that of the gate electrodes. In that case, the leakage currents are substantially completely eliminated. If necessary, said pattern may function as a black mask. The leakage currents may also be reduced by giving the gate electrode and said electrode meshing comb structures. Also the reverse structure (guard lines above and gate electrodes below the semiconductor layer) is possible.

Another embodiment of a display device according to the invention is characterized in that the layer of organic material comprises organic semiconductor material surrounded by insulating organic material at least at the area of the switching elements. In this case, the insulating organic material is obtained by selectively illuminating a polymer semiconductor material (for example, polythenylene vinylene (PTV)) locally with UV radiation by means of a mask so that it changes into insulating organic material. In this respect, it is to be noted that insulating the channel part for single TFT transistors is described in example 11 of U.S. Pat. No. 5,854,139.

Since depolarization may occur when using plastic substrates, polarizers are preferably used as substrates. It is alternatively possible to choose electro-optical effects at which no external polarizers are used such as, for example, PDLC.

These and other aspects of the invention are apparent from and will be elucidated with reference to the embodiments described hereinafter.

BRIEF DESCRIPTION OF DRAWINGS

In the drawings:

FIG. 9 is a plan view of a part of another display device according to the invention, while

The Figures are diagrammatic and not drawn to scale. Corresponding components are generally denoted by the same reference numerals.

DESCRIPTION OF THE PREFERRED EMBODIMENTS

Figure 1:
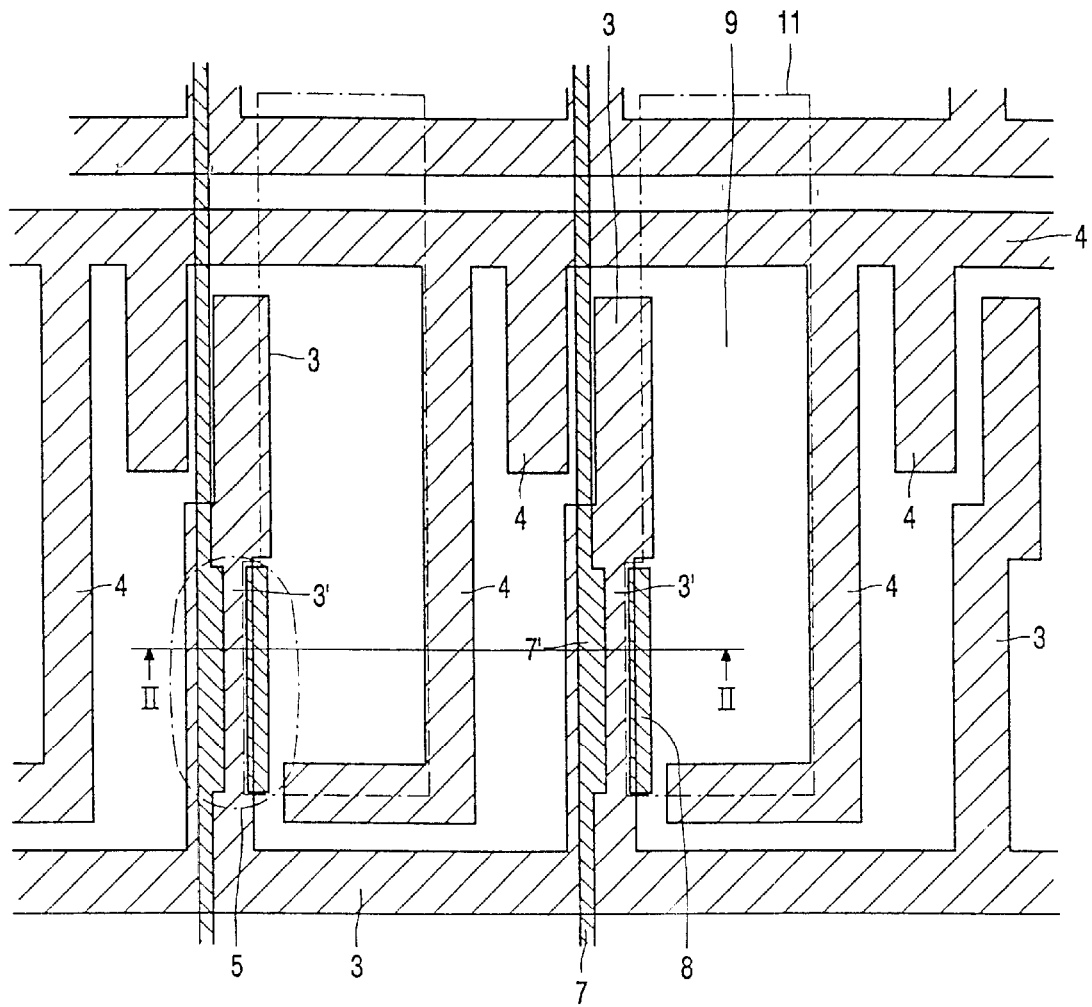
FIG. 1 is a plan view of a part of a display device according to the invention.
Figure 2:
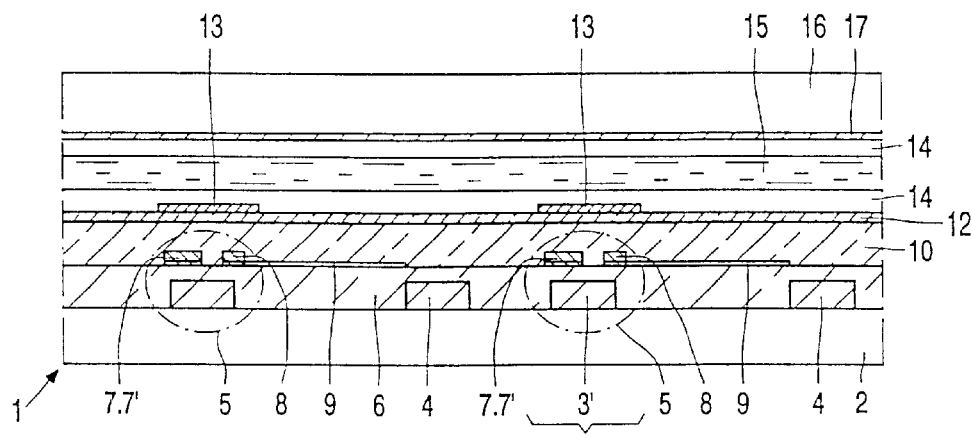
FIG. 2 is a diagrammatic cross-section taken on the line II—II in FIG. 1.

FIG. 1 is a plan view of a part of a matrix of pixels and FIG. 2 is a cross-section of a liquid crystal display device 1 based thereon. A conducting pattern 3, 4 of, for example, aluminum or another suitable conducting material such as, for example, polyaniline (PANI) is provided on a (plastic) substrate 2. In this example, the pattern 3 comprises row electrodes and also gate electrodes 3' at the locations of transistors 5. The conducting pattern 3, 4 is coated with an insulating layer 6 which is planarized in this example. In this example, an organic insulating layer of, for example, polyvinylphenol (PVP) is used, crosslinked with hexamethoxy methylmelamine (HMMM) which is optically transparent. Column electrodes 7 comprising source contacts 7' and drain contacts 8 which contact picture electrodes 9 (the edges of the picture electrodes 9 are denoted by dot-and-dash lines 11 in FIG. 1) are present on the organic insulating layer 6. One continuous layer of organic semiconductor material 10 is provided on the assembly. Examples of organic semiconducting materials are, inter alia, polypyrroles, polyphenylenes, polypthioptenes, poly(di)acetylenes and polyanilines. TFT transistors (denoted by reference numeral 5 in FIGS. 1, 2) which are driven via the gate electrodes 3' are thus formed at the area of juxtaposed source and drain contacts 7, 8. The layer of organic semiconductor material 10 is coated with an insulating layer 12. The contacts and electrodes 7, 8, 9 are obtained, for example, by first providing a double layer of indium tin oxide and metal and patterning this layer so that the double layer is maintained at the area of these contacts and electrodes 7, 8, 9. Subsequently, the metal is etched selectively, so that the picture electrodes 9 are free.

In the TFT transistors, the voltage at the gate electrodes determines whether there is conduction or no conduction between source and drain. In this example, with the p-conductivity type of the semiconductor material, the gate area is depleted with a positive voltage at the gate electrodes relative to the source or drain electrodes.

According to the invention, each pixel is substantially completely surrounded by an electrode 4 which, at a sufficiently positive voltage of the gate relative to the source/drain, causes depletion in the superjacent part of the semiconductor material. To this end, the ultimate device of FIG. 2 may be provided with a special voltage source. In this way, the different pixels can be mutually insulated without having to etch the semiconductor structure.

In this example, a black mask 13 which counteracts the influence of incident light on the transistor action is present on the insulating layer 12. Furthermore, the liquid crystal display device comprises a second substrate 16 provided with a counter electrode 17, while in this example the display device is provided in generally known manner with orientation layers 14 and a liquid crystalline material 15 which, if necessary, may be polymerized.

In this example, the picture electrode overlaps the (previous) address line (gate line) with which and with the intermediate insulating material it forms a storage capacitance $C_{st}$ in generally known manner, which may even be increased by providing this above the mask 4.

Although the device may be provided, as usual, with one or more polarizers, a polarizer is preferably used as a substrate so as to prevent depolarizing effects, or an LC effect (or another electro-optical effect) at which no external polarizers are used.

Figure 3:
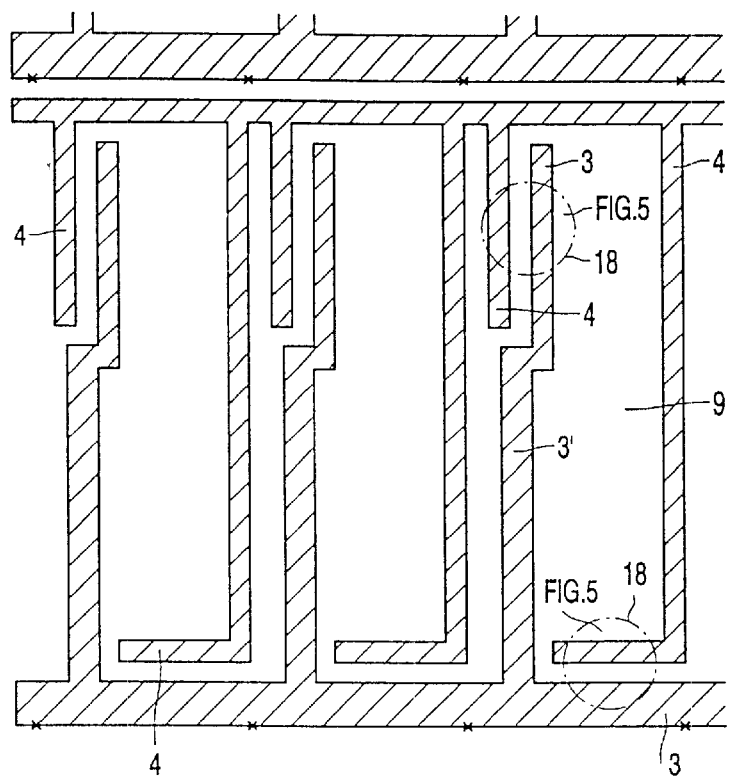
FIGS. 3 and 4 show possible configurations of a metallization pattern.
Figure 4:
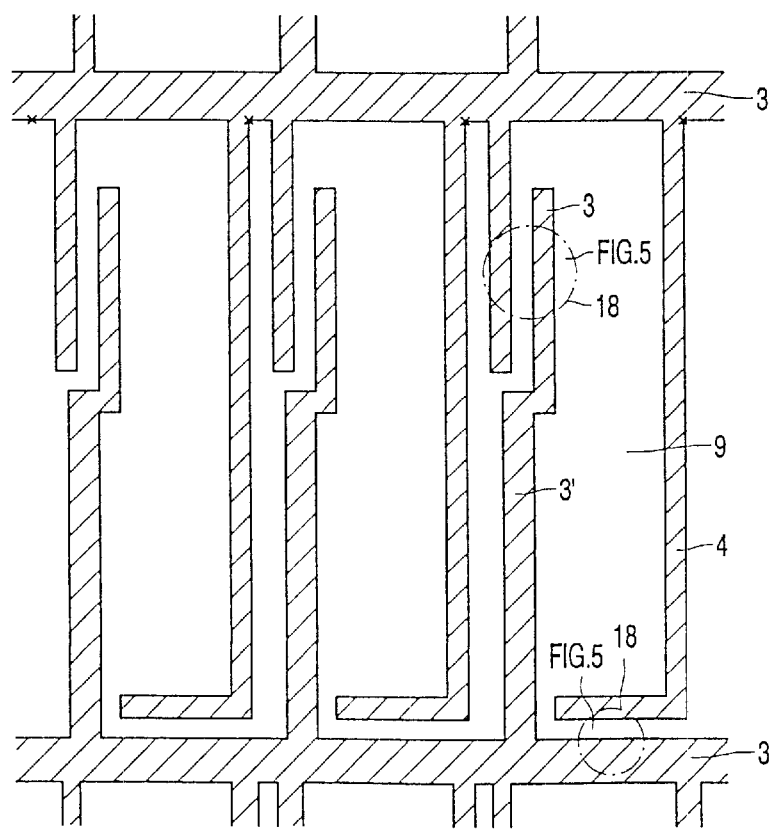
Figure 5:
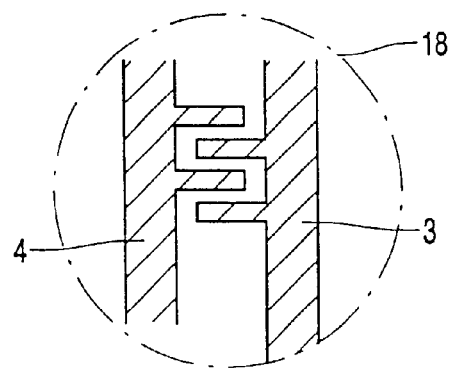
FIG. 5 shows a detail of a variant of FIGS. 2, 3.

FIG. 3 shows how the metallization pattern (guard line) 4 substantially completely surrounds a picture electrode 9, which is shown diagrammatically, but also reduces the effective pixel surface. FIG. 4 shows an alternative in which the two masks 3, 4 are integrated, as it were. Each guard line is then connected to the previous gate line. In this case, the first row of pixels must be connected to an extra (dummy) line. When a row is being written, a small leakage current may flow for some time to picture electrodes of the subsequent row to be selected. Since this row is written immediately thereafter, at which the voltage on the previous row has a sufficient blocking voltage, this effect, averaged through a frame period, is negligible. In both cases, the leakage paths (possible current paths between the columns 3 and the picture electrodes at the areas 18 shown diagrammatically) can be extended by giving the gate lines and the guard lines meshing structures, as is shown in FIG. 5.

Figure 6:
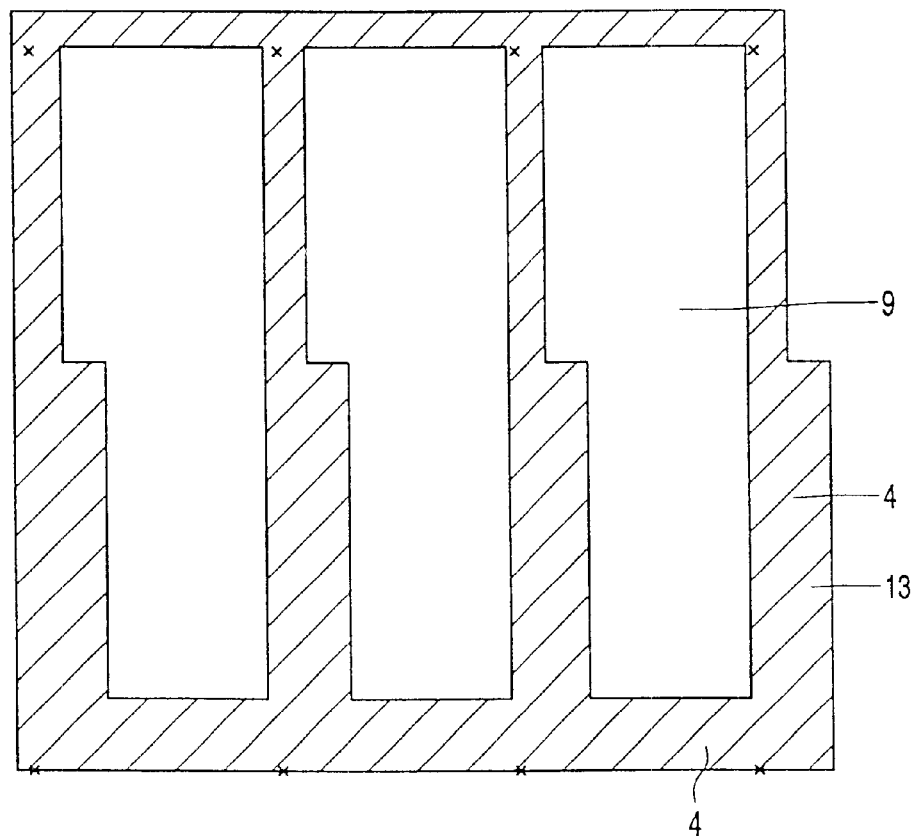
FIG. 6 shows another possible configuration of a metallization pattern.
Figure 7:
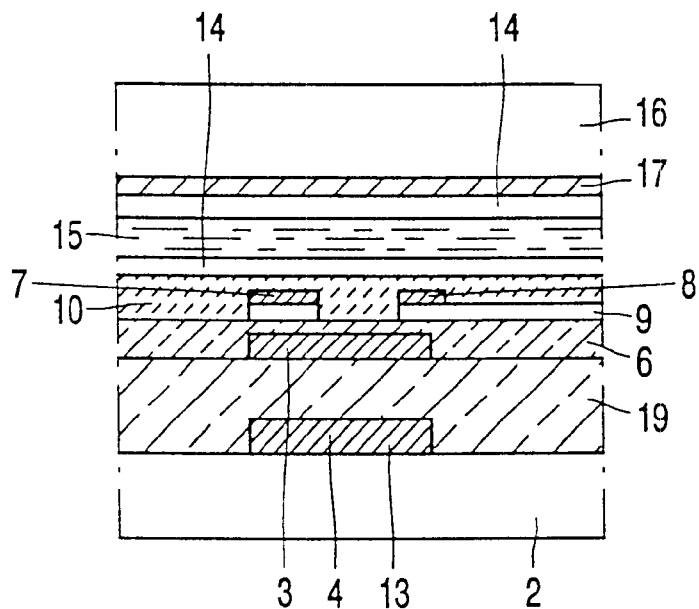
FIG. 7 is a cross-section of a display device, associated with the pattern shown in FIG. 6.

FIG. 6 shows a structure in a plan view of a conductor pattern (guard line) 4 which substantially completely surrounds a picture electrode 9 shown diagrammatically. The guard line 4 is directly present on the substrate 2. The TFT transistors at the area of the source and drain contacts 7, 9, which are driven via the gate electrode 3, are present on an extra insulating layer 19 and are shielded thereby from incident light. Other reference numerals have the same significance as in FIG. 1. As compared with the device of FIG. 2, an extra masking step is now necessary. However, by dimensioning the guard line 4 in this example in such a way that it also forms a black mask 13, a masking step can be omitted again.

Figure 8:
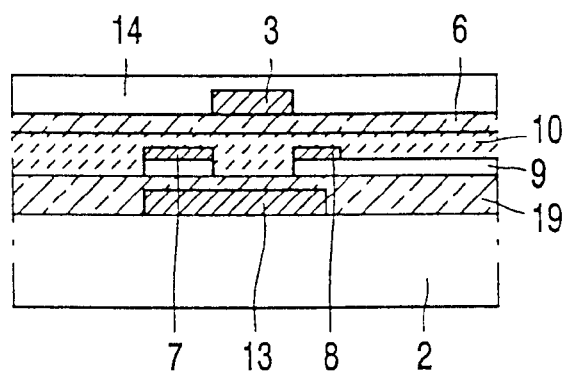
FIG. 8 shows a part of a variant of FIG. 7.

In the example of FIG. 6, 7, two insulating layers 6, 19 are present between the conductor pattern (guard line) 4 and the layer 10 of organic semiconductor material so that an extra high voltage is necessary to cause depletion in the superjacent part of the semiconductor material. In the variant of FIG. 8, this is prevented by providing the electrode configuration 6, 8, 9 (source, drain, picture electrode) directly on the insulating layer 19 and to provide this layer with a layer 10 of organic semiconductor material, and by subsequently providing the insulating layer 6 as well as the gate electrode 3. Such a "top-gate configuration" may also be used in the device of FIG. 2 instead of the "bottom-gate configuration" shown in this Figure; in that case, the conductor pattern 3, 4 is on top of the layer 10 of organic semiconductor material.

Figure 9:
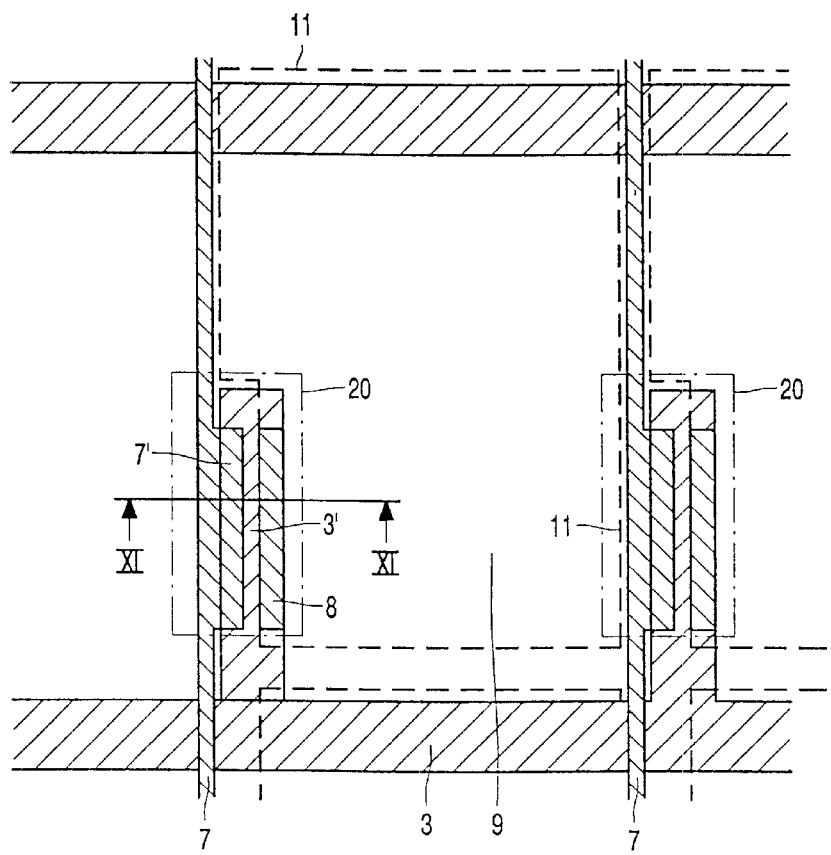
Figure 10:
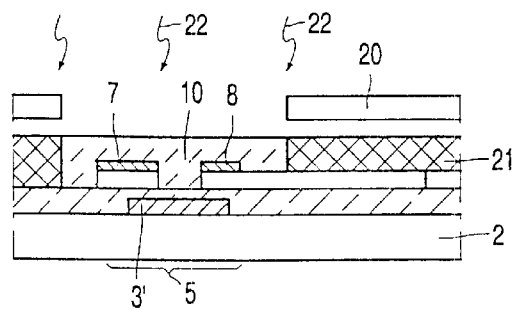
FIG. 10 is a diagrammatic cross-section taken on the line XI—XI in FIG. 9 during its manufacture.
Figure 11:
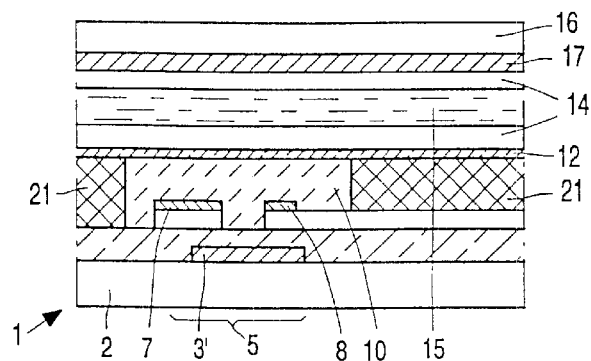
FIG. 11 is a cross-section of a display device, taken on the line XI—XI in FIG. 9.

FIG. 9 is another plan view of a part of a matrix of pixels, and FIG. 11 is a cross-section of a liquid crystal display device 1 based thereon. A conducting pattern 3 of, for example, polyaniline (PANI) aluminum, chromium or another suitable material is provided on a (plastic) substrate 2. In this example, the pattern 3 comprises row electrodes and gate electrodes 3' at the locations of transistors 5. The conducting pattern 3 is coated again with an insulating layer 6 of, for example, polyvinylphenol (PVP), crosslinked with hexamethoxy methylmelamine (HMMM) which is optically transparent. Again, column electrodes 7 which comprise source contacts 7' and drain contacts 8 contacting picture electrodes 9 (the edges of the picture electrodes 9 are denoted by broken lines 11 in FIG. 9) are present on the organic insulating layer 6. One continuous layer of organic semiconductor material 10 is provided on the assembly, so that TFT transistors (denoted by braces 5) which are driven via the gate electrodes 3' are formed at the area of juxtaposed source and drain contacts 7, 8. The layer of organic semiconductor material 10 is subsequently converted locally into organic insulating material 21. To this end, the layer 10 is illuminated with UV radiation 22 via a mask 20 (FIG. 10), with the organic semiconducting material 10 becoming insulating at the illuminated areas. The contours of the mask 20 used are denoted by dot-and-dash lines 20 in FIG. 9. In this case, only the area near the TFT transistors is still semiconducting but this is not strictly necessary as long as different TFT transistors are mutually insulated by the insulating parts 21. Other reference numerals in FIG. 11 have the same significance as in FIG. 2.

The invention is of course not limited to the examples shown. For example, reflective display devices may also be realized by starting from non-transparent substrates and by forming the picture electrodes as reflecting electrodes. For example, aluminum is then chosen as a material for the picture electrodes. A double layer is then not necessary for providing the column electrodes 7 (and the source and drain electrodes 7', 8) and the picture electrodes 9.

In summary, the invention relates to a display device based on an active matrix, in which switching elements are formed in a layer of organic semiconductor material, which switching elements are mutually insulated via depletion areas or insulating areas in the same layer of organic semiconductor material.

What is claim is:

1. A display device comprising a matrix of picture electrodes on a substrate, which picture electrodes are connected via switching elements to drive electrodes for presenting drive signals, characterized in that the display device comprises a layer of organic material accommodating a plurality of switching elements, characterizing in that the substrate comprises a layer of organic semiconductor material at least at the area of the switching elements and the picture electrodes, and the display device comprises means for supplying at least an electrode, which viewed perpendicularly to the substrate, substantially completely surrounds a picture electrode, with such a voltage that layers of organic semiconducter material are substantially and completely insulated from each other at the area of switching elements and associated picture electrodes.

2. A display device as claimed in claim 1, characterized in that the electrode comprises a gate of electrode of a field effect transistor for connecting a pixel in an adjacent row.

3. A display device as claimed in claim 1 or 2, characterized in that the electrode completely surrounds a picture electrode.

4. A display device as claimed in claim 3, characterized in that the electrode forms a black mask.

* * * * *